(12) United States Patent
Lee et al.

(10) Patent No.: US 7,608,507 B2
(45) Date of Patent: Oct. 27, 2009

(54) NAND FLASH MEMORY DEVICES AND METHODS OF FABRICATING THE SAME

(75) Inventors: Ji-Hwon Lee, Gyeonggi-do (KR); Sung-Hoi Hur, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/216,393

(22) Filed: Jul. 3, 2008

(65) Prior Publication Data

US 2008/0268595 A1    Oct. 30, 2008

Related U.S. Application Data

(62) Division of application No. 11/509,007, filed on Aug. 24, 2006, now Pat. No. 7,411,239.

(30) Foreign Application Priority Data

Aug. 26, 2005    (KR) .................. 10-2005-0078813

(51) Int. Cl.
    *H01L 21/336*    (2006.01)
(52) U.S. Cl. ..................................... 438/258; 438/257

(58) Field of Classification Search .................. 438/257, 438/258
See application file for complete search history.

(56) References Cited

U.S. PATENT DOCUMENTS

| 7,233,522 | B2 * | 6/2007 | Chen et al. ............. 365/185.02 |
| 2006/0018181 | A1 | 1/2006 | Matsunaga et al. | |

FOREIGN PATENT DOCUMENTS

| JP | 05-167080 | 7/1993 |
| JP | 11-145431 | 5/1999 |
| JP | 2001-308209 | 11/2001 |

* cited by examiner

*Primary Examiner*—Zandra Smith
*Assistant Examiner*—Paul E Patton
(74) *Attorney, Agent, or Firm*—Harness, Dickey & Pierce, P.L.C.

(57) ABSTRACT

A NAND includes a device isolation pattern disposed in a region of a substrate defining a plurality of active regions. Memory transistors having memory gate patterns, constituting a cell string, cross the plurality of active regions. Select transistors are disposed over the memory transistors, and lower plugs are disposed on each side of the cell string to electrically connect the plurality of active regions on both sides of the cell string and the select transistors.

18 Claims, 16 Drawing Sheets

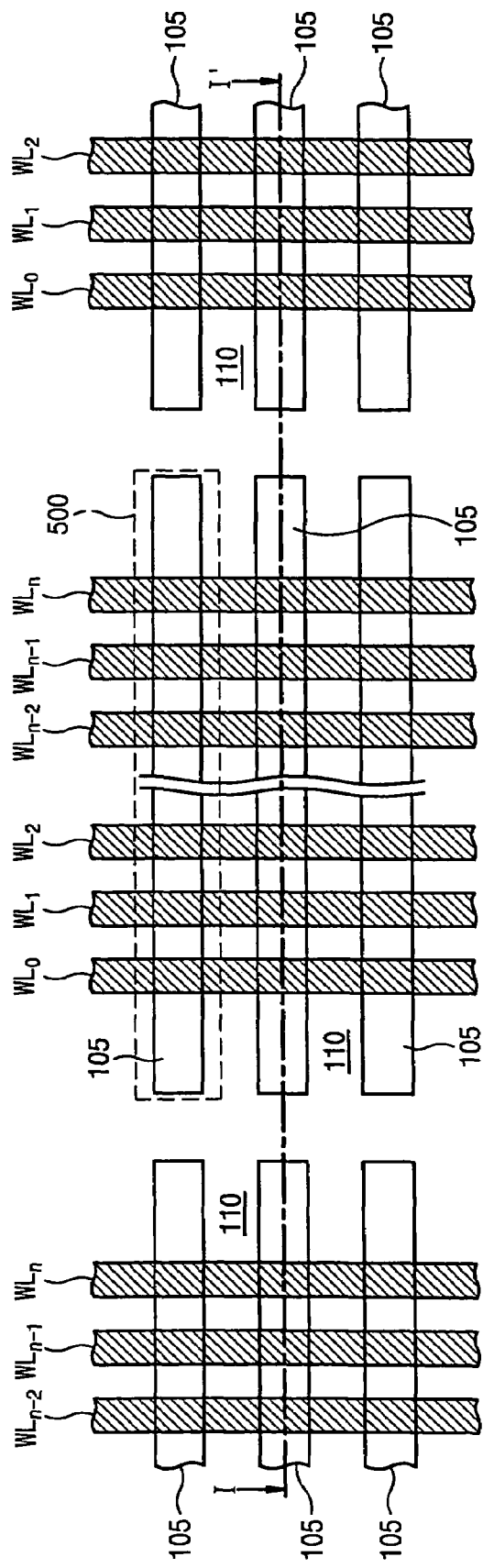

NAND FLASH MEMORY DEVICES AND METHODS OF FABRICATING THE SAME

PRIORITY STATEMENT

This application is a divisional of application Ser. No. 11/509,007 filed on Aug. 24, 2006 now U.S. Pat. No. 7,411,239, and from which priority is claimed under 35 U.S.C. §120. This application also claims priority from Korean Patent Application No. 10-2005-0078813 filed on Aug. 26, 2005, in the Korean Intellectual Property Office under 35 U.S.C. §119. The entire contents of both of these applications are incorporated herein by reference.

BACKGROUND OF THE INVENTION

Description of the Related Art

Related art semiconductor memory devices are classified as volatile or non-volatile memory devices depending on whether or not a power is necessary to maintain stored data. Volatile memory devices such as a dynamic random access memory (DRAM) and a static random access memory (SRAM) have relatively higher operating speeds, but may have limited applicability because power is required for maintaining stored data. Non-volatile memory devices, such as a flash memory do not require power to maintain stored data, and thus, may be more widely used in portable electric devices.

Related art flash memory devices may have a NOR-type structure or a NAND-type structure depending on the manner in which memory cells are connected to a bit line and a ground electrode. In a related art NOR-type flash memory device (hereinafter NOR flash), memory cells may be connected in parallel between the bit line and the ground electrode. This configuration may enable faster random access. NOR flashes may be used in basic input output systems (BIOS), cellular phones, personal digital assistants (PDA), etc.

In a related art NAND-type flash memory device (hereinafter, NAND flash), memory cells may be connected serially between a bit line and a ground line. FIG. 1 illustrates a related art NAND flash. As shown, a cell array 50 may include a plurality of cell strings 10. Each of the cell strings may include a plurality of memory cells connected serially. A ground select transistor and a string select transistor, connected by a ground select line GSL and a string select line SSL, respectively, may be arranged at each end of the cell string 10 to control an electrical connection between the memory cells and the bit lines 40 and ground electrode 45.

Because of the serial structure of related art NAND flashes, NAND flashes have a higher degree of integration than related art NOR flashes. In addition, data stored in a plurality of memory cells may be changed simultaneously, and thus, NAND flashes may update stored data faster than related art NOR flashes. As a result, related art NAND flashes may be more widely used in portable electric products requiring mass storage such as digital cameras, MP3 players, etc.

In the related art NAND flashes, because the ground select lines GSL and the string select lines SSL disposed on the cell array region have a line width wider than that of word lines $WL_0$ to $WL_n$, integration density may be limited. Moreover, to reduce an electrical disturbance in related art NAND flashes, the ground select lines GSL and the string select lines SSL are spaced a distance apart from an adjacent word line WL1 or $WL_n$, respectively. Because the spaced distance is wider than a distance between the word lines, the integration density of related art NAND flashes may be limited. Additionally, because the ground select lines GSL and the string select lines SSL have a structure different from that of the memory cell transistors, an additional process may be required to fabricate the ground select lines GSL and string select lines SSL. For example, unlike the memory cell transistors, in related art NAND flashes, the ground select lines GSL and the string select lines SSL do not include an electrically-isolated floating gate electrode. Accordingly, an additional process may be needed to remove a gate interlayer insulation layer from the ground select lines GSL and the string select lines SSL.

SUMMARY

Example embodiments relate to semiconductor devices and methods of fabricating the same. At least one example embodiment provides a NAND flash memory device, and at least one other example embodiment provides a method of fabricating the same.

A NAND flash memory device, according to at least one example embodiment, may have an increased degree of integration. A method of fabricating a NAND flash memory device, according to at least one example embodiment, may increase the degree of integration.

At least one example embodiment provides a method of fabricating a NAND flash memory device. In at least this example embodiment, a plurality of active regions may be defined in a substrate. Memory transistors may be formed on the active regions. The memory transistors may include memory gate patterns arranged perpendicular to the plurality of active regions. Lower plugs may be formed and may be electrically connected to first regions of the plurality of active regions. Select transistors may be formed above the memory gate patterns, and the select transistors may include impurity regions. At least one impurity region of each select transistor may be electrically connected to a respective first region via a lower plug.

At least one other example embodiment provides a NAND flash memory device. At least this NAND flash memory device may include active regions formed in a substrate, a cell string including memory transistors, select transistors and lower plugs. The memory transistors may include memory gate patterns formed above the active regions. The select transistors may be arranged above the memory transistors, and the lower plugs may be arranged on each side of the cell string to electrically connect the active regions disposed on each side of the cell string and the select transistors.

At least one other example embodiment provides a method of fabricating a NAND flash memory device. In at least this method, device isolation patterns may be formed in a region of a substrate to define active regions. Memory transistors may be formed on the active regions. The memory transistors may have memory gate patterns crossing over the active regions. Lower plugs may be formed and electrically connected to regions of the active regions using epitaxial growth. Select transistors may be formed over the memory gate patterns, and the select transistors may have upper impurity regions connected electrically to the lower plugs.

In at least some example embodiments, the forming of the memory transistors may include forming select transistors over the memory transistors. In at least this method, a gate insulation layer may be formed on the active regions, and the plurality of memory gate patterns may be formed parallel to each other on the gate insulation layer. Lower impurity regions may be formed on the active regions on both sides of the memory gate patterns through an ion implantation process using the memory gate patterns as an ion mask.

In at least some example embodiments, the forming of the lower plugs may include forming a bottom interlayer insulation layer on the result on which the memory transistors are formed, forming contact holes to expose predetermined regions of the lower impurity regions by patterning the bottom interlayer insulation layer, and forming the lower plugs disposed in the contact holes by forming an epitaxial layer that fills the contact holes through epitaxial growth. The epitaxial layer may be formed using a selective epitaxial process that locally grows the epitaxial layer from the active regions exposed through the contact holes.

In at least one other example embodiment, a NAND flash memory device disposing select transistors over the memory transistors may include a device isolation pattern disposed in a region of a substrate to define active regions. The memory device may further include memory transistors having memory gate patterns to constitute a cell string. The memory gate patterns may cross over the active regions. Select transistors may be disposed over the memory transistors, and lower plugs may be disposed on both sides of the cell string to electrically connect the active regions on the both sides of the cell string and the select transistors. The lower plug may be formed of a single-crystalline silicon of a conductive type different from that of the substrate.

BRIEF DESCRIPTION OF THE DRAWINGS

Example embodiments will be described with respect to the drawings in which:

FIGS. 2A to 6A are plan views illustrating a method of fabricating a NAND flash memory device, according to an example embodiment;

FIGS. 2B to 6B are sectional views illustrating a method of fabricating a NAND flash memory device, according to an example embodiment;

FIGS. 7A and 7B are a plan view and a sectional view, respectively, illustrating a method of fabricating a NAND flash memory device, according to another example embodiment;

DETAILED DESCRIPTION OF EXAMPLE EMBODIMENTS

Figure 1:
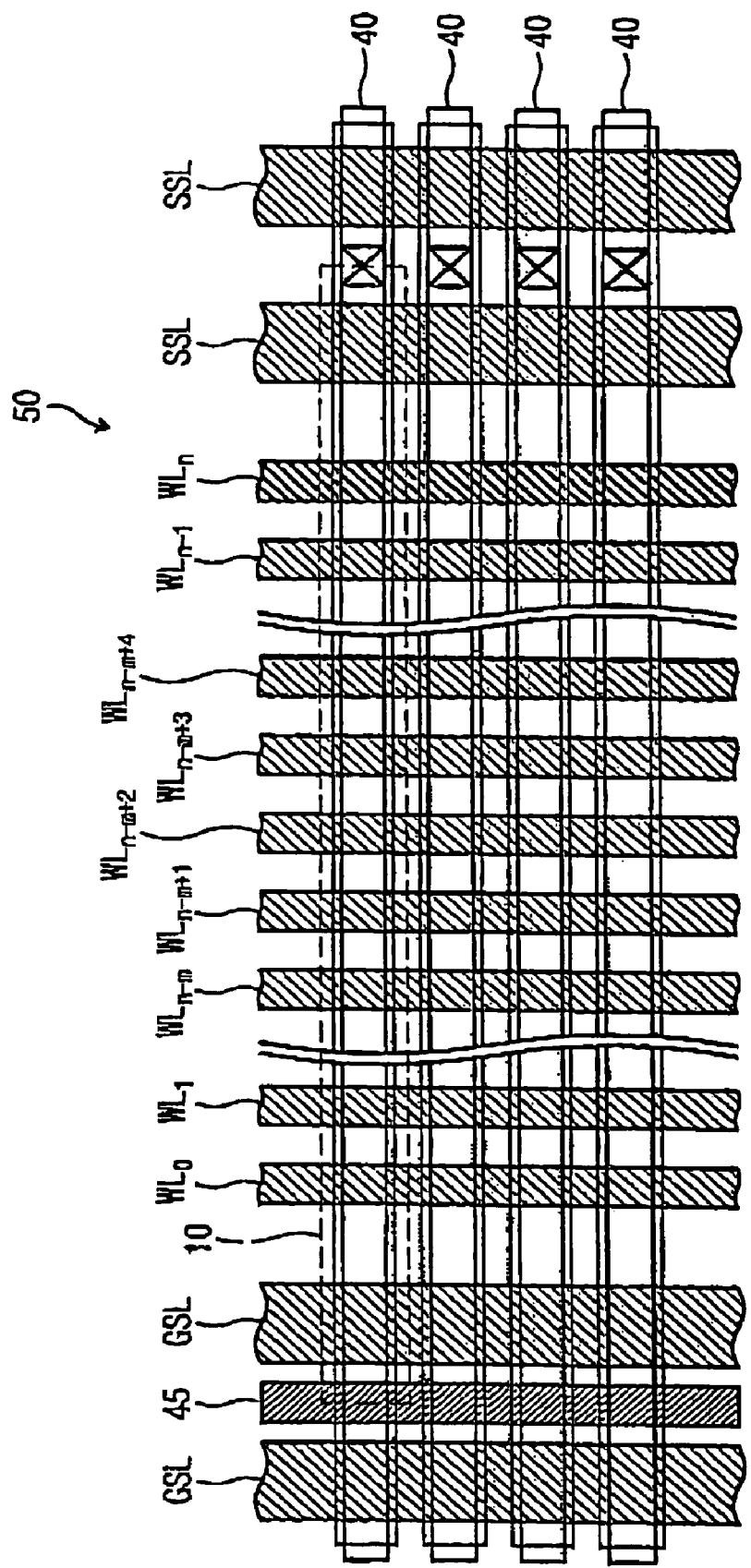
FIG. 1 is a plan view illustrating a portion of a cell array of a related art NAND flash memory device.

Various example embodiments will now be described more fully with reference to the accompanying drawings in which some example embodiments are shown. In the drawings, the thicknesses of layers and regions are exaggerated for clarity.

Detailed illustrative example embodiments are disclosed herein. However, specific structural and functional details disclosed herein are merely representative for purposes of describing example embodiments. However, the present invention may be embodied in many alternate forms and should not be construed as limited to only the example embodiments set forth herein.

Accordingly, while example embodiments are capable of various modifications and alternative forms, example embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the present invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

In addition, although example embodiments are discussed herein with respect to particular conductive-types (e.g., p-type or n-type), it will be understood that these conductive-types may be interchanged.

FIGS. 2A to 6A are plan views illustrating a method of fabricating a NAND flash memory device, according to an example embodiment. FIGS. 2B to 6B are sectional views illustrating a method of fabricating a NAND flash memory device, according to an example embodiment. FIGS. 2B to 6B are sectional views taken along line I-I' of FIGS. 2A to 6A.

Figure 2A:
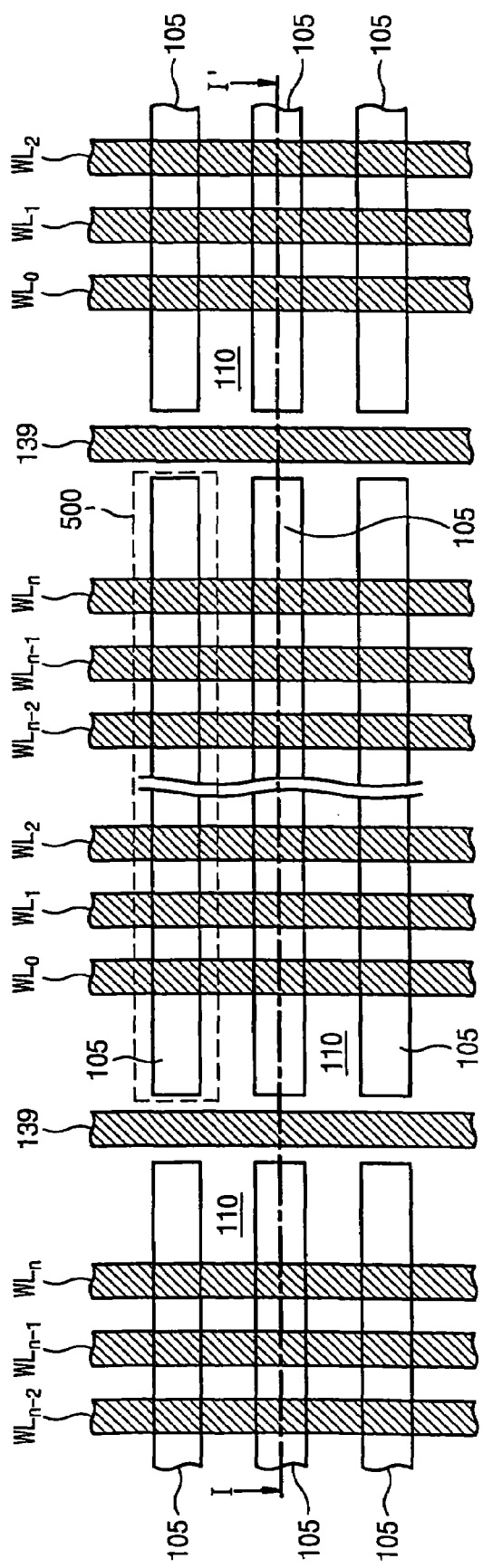
Figure 2B:
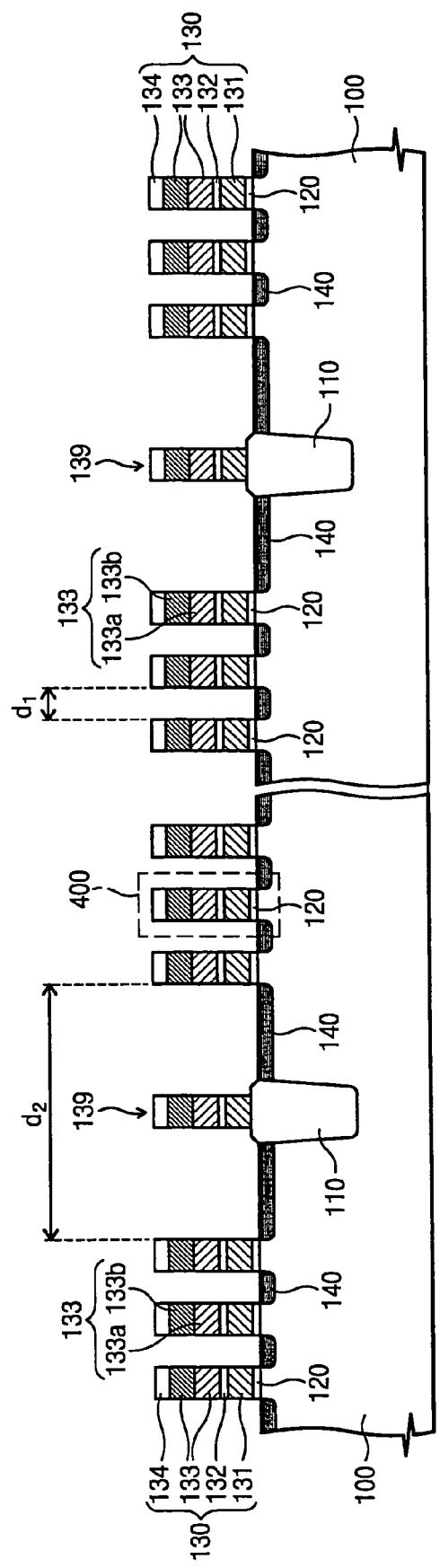

Referring to FIGS. 2A and 2B, a device isolation pattern 110 may be formed in a region of a semiconductor substrate 100. The device isolation pattern 110 may define active regions 105. The semiconductor substrate 100 may be formed of, for example, a single-crystalline silicon of a first conductive type (e.g., p-type). Each of the active regions 105 may be linear, parallel to each other, and may have a width and a length perpendicular to the width. In at least this example embodiment, the width of the active regions 105 may be wider than the length.

A gate insulation layer 120 may be formed on the active region 105. The gate insulation layer 120 may be formed of an insulating material such as a silicon oxide layer, a silicon nitride layer, a combination thereof or the like. In at least one example embodiment, a silicon oxide layer may be formed using, for example, a thermal oxidation process or the like. Memory gate patterns 130, crossing (e.g., arranged above and perpendicular or substantially perpendicular to) the active regions 105, may be formed on the resultant structure including the gate insulation layer 120. The memory gate patterns 130 may be used as word lines to select transistors in a cell array.

The memory gate pattern 130 may be formed of a floating gate pattern 131, a gate interlayer insulation layer 132 and a control gate pattern 133 stacked, for example, sequentially. A capping pattern 134 may also be formed on the control gate pattern 133. The capping pattern 134 may be used as an etching mask in a patterning process used to form the memory gate pattern 130. The floating gate pattern 131 may be formed of a polycrystal, and the gate interlayer insulation layer 132 may be formed of, for example, a silicon oxide layer, a silicon nitride layer and/or a silicon oxide layer stacked sequentially. Additionally, the control gate pattern 133 may be formed of a polysilicon layer 133a and a silicide layer 133b stacked, for example, sequentially. In an alternative, example embodiments may be applied to floating trap-type non-volatile memory devices. In at least this example, the floating gate pattern 131 may be an insulation layer (e.g., a silicon nitride layer or the like) with abundant trap sites, and the gate interlayer insulation layer 132 may be, for example, a silicon oxide layer or the like.

A lower impurity region 140 may be formed in the active region 105 between the memory gate patterns 130 by performing an ion implantation process using the memory gate pattern 130 as an ion mask. The lower impurity region 140 may have a conductive type (e.g., an n-type) different from that of the semiconductor substrate 100. The memory gate patterns 130 and the lower impurity regions 140 constitute memory transistors 400. For example, the memory gate patterns 130 may be used as gate electrodes of the memory transistor 400, and the lower impurity regions 140 may be used as source and drain electrodes of the memory transistor 400. According to at least one example embodiment, two adjacent memory transistors 400 may share a lower impurity region 140 as a source electrode or a drain electrode. The memory transistors 400 may be serially connected to each other via the shared lower impurity regions 140.

A plurality of memory transistors 400 connected to each other serially may constitute a cell string 500. The cell string 500 may be disposed perpendicular or substantially perpendicular to the memory gate patterns 400. According to at least some example embodiments, the cell string 500 may include 8 to 128, inclusive, memory transistors 400, and may include 16 to 32, inclusive, memory transistors 400.

Figure 7B:
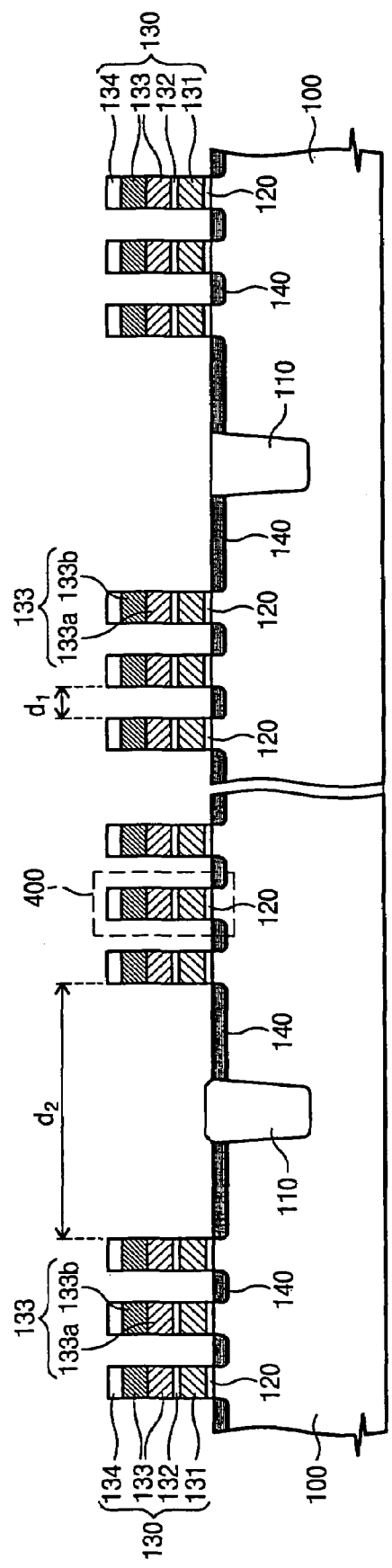

Alternatively, in at least some other example embodiments, as illustrated in FIGS. 2A and 7A, the active region 105 may be divided in a direction of the memory gate pattern 130 through the device isolation pattern 110. Accordingly, the cell strings 500 disposed along the direction of the active region 105 may be electrically separated by a portion of the device isolation pattern 110 disposed in the direction of the memory gate pattern 130. In at least this example, the lower impurity regions 140 in a different cell string 500, as illustrated in FIGS. 2B and 7B, may be electrically separated by the device isolation pattern 110. This electrical isolation may be needed for selective access of the cell strings 500 disposed along the direction of the active regions 105.

Figure 8A:
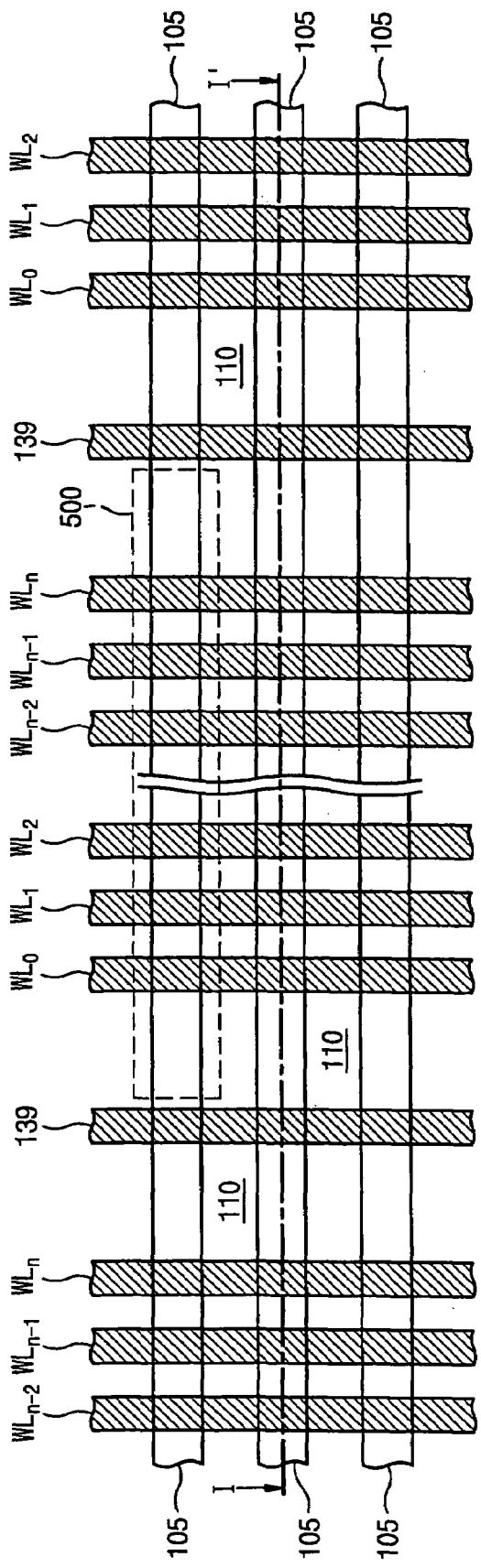
FIGS. 8A and 8B are a plan view and a sectional view, respectively, illustrating a method of fabricating a NAND flash memory device, according to another example embodiment.
Figure 8B:
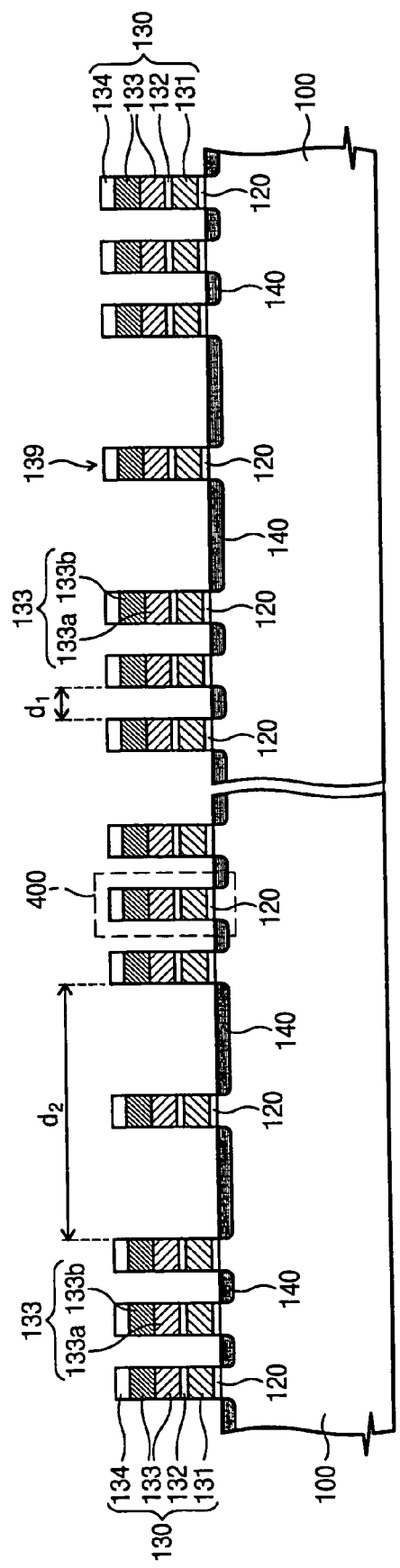

According to another example embodiment, the lower impurity regions may be electrically isolated as illustrated in FIGS. 8A and 8B. In this example embodiment, dummy gate patterns 139 may be disposed between the cell strings 500 in directions of the memory gate patterns 130. The dummy gate patterns 139 may be formed together (e.g., simultaneously or concurrently) with the memory gate patterns 130, and as a result, the dummy gate patterns 139 may be formed with the same or substantially the same structure as the memory gate patterns 130.

Alternatively, respective cell strings 500 may be formed on the same or substantially the same active region 105. In this example, the active regions 105 may not be separated in a direction of the memory gate pattern 130 by the device isolation patterns 110. Consequently, the dummy gate patterns 139 may cross over the active regions 105 in a direction of the memory gate pattern 130. However, in at least this example, the lower impurity regions 140 may be formed using the dummy gate pattern 139 as a mask, and thus, may not be formed below the dummy gate pattern 139. Accordingly, the different cell strings 500 formed on the same active region 105 may be electrically separated.

The dummy gate patterns 139 may help reduce difficulty associated with photolithography when forming the memory gate patterns 130. For example, if dummy gate patterns 139 are not formed, a distance $d_2$ between two adjacent memory gate patterns 130 constituting different cell strings 500 may be larger or substantially larger than a distance $d_1$ between two adjacent memory gate patterns 130 in the same or substantially the same cell string 500. This may result in defects during photolithographic processes because the intensity of an incident light is different depending on a position. Therefore, if the dummy gate patterns 139 are disposed between the two cell strings 500, defects associated with photolithography may be suppressed.

As illustrated in FIG. 2B, the dummy gate patterns 139 may be disposed on the device isolation pattern 110 between the cell strings 500.

Figure 3A:
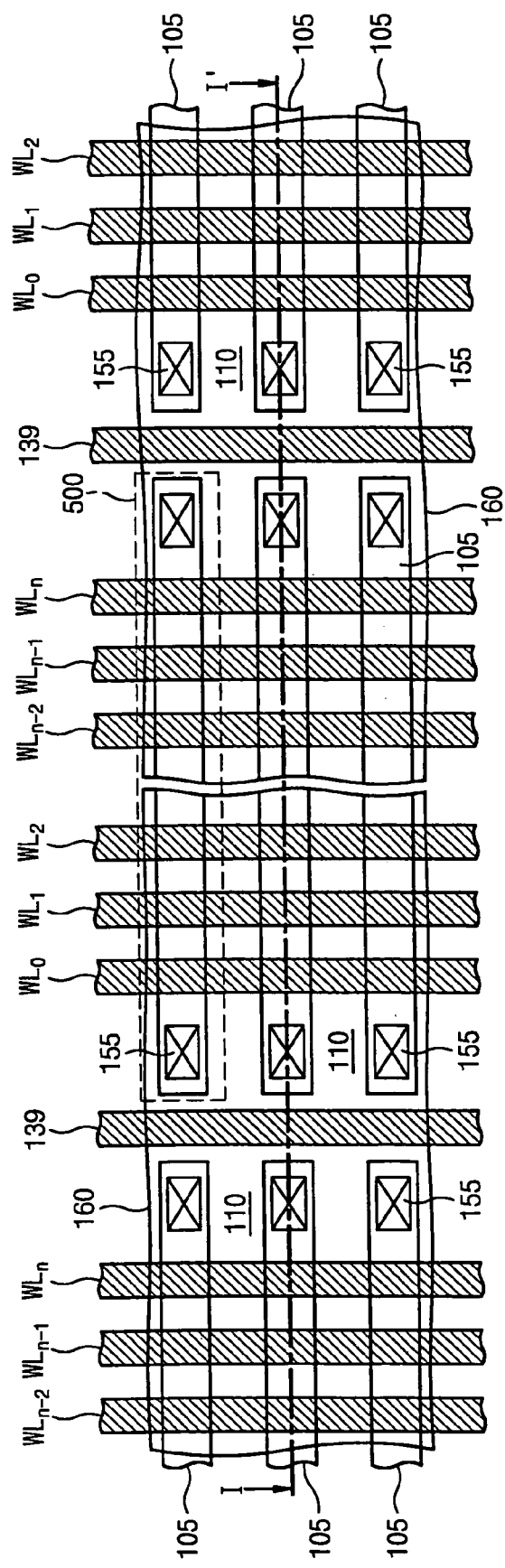
Figure 3B:
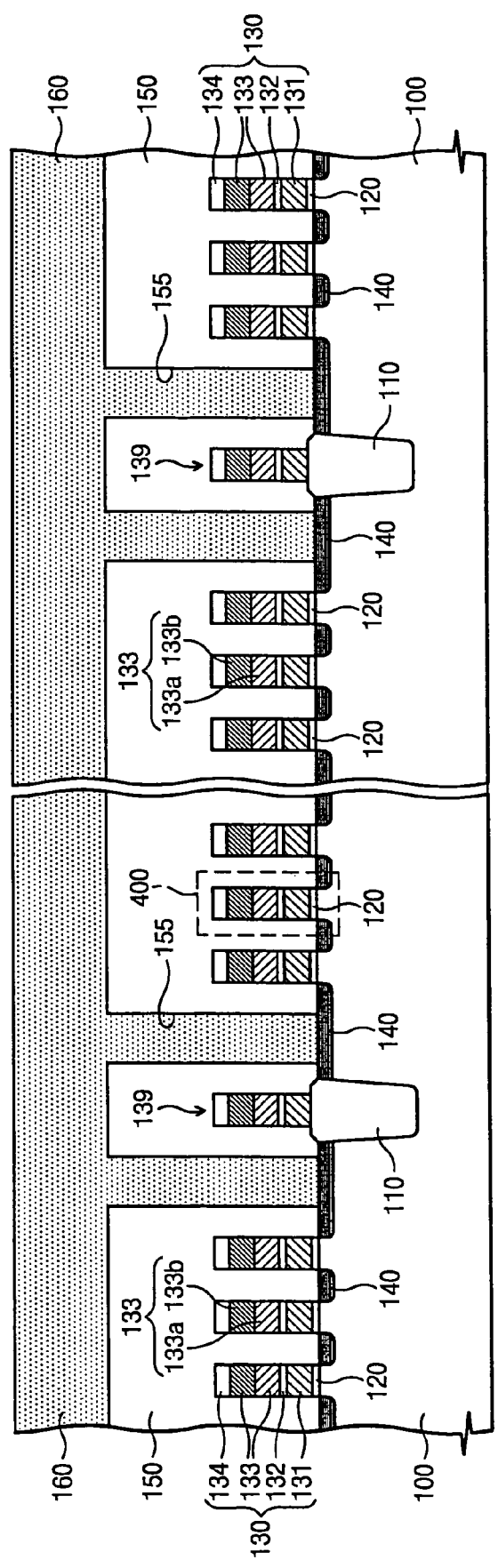

Referring to FIGS. 3A and 3B, a lower interlayer insulation layer 150 may be formed on the resultant structure on which the lower impurity regions 140 are formed. The bottom interlayer insulation layer 150 may be formed of at least one of a silicon nitride layer and low-k dielectrics. Additionally, before forming the lower interlayer insulation layer 150, an etching suppression or prevention (or etch stop) layer (not shown) may be formed. The etching suppression layer may conformally cover a spacer on a sidewall of the memory gate pattern 130, or the resultant structure on which the spacer is formed.

Contact holes 155 may be formed to expose the upper surfaces of the lower impurity regions 140 by patterning the lower interlayer insulation layer 150. The bottom contact holes 155 may be formed by etching (e.g., anisotropic etching) using an etching solution (e.g., etching recipe) with an etching selectivity relative to the semiconductor substrate 100. The contact holes 155 may expose the upper surfaces of the lower impurity regions 140 disposed on the each side of the cell strings 500. Consequently, one cell string 500 may include two contact holes 155, and each contact hole 155 may be used as a passage to connect the ground select transistor and the string select transistor with the cell string 500.

An epitaxial layer 160 may be formed to fill the contact holes 155. The epitaxial layer 160 may be a single-crystalline silicon formed using an epitaxial growth process, technique and/or method. In at least this example, the epitaxial layer 160 may have the same or substantially the same conductive type as the lower impurity region 140, and the epitaxial growth process may include injecting impurities into the epitaxial layer 160. The impurities may be injected in-situ, for example, during the formation of the epitaxial layer.

According to at least this example embodiment, the forming of the epitaxial layer 160 may be performed using a selective epitaxial process. A selective epitaxial process is a process in which silicon layer of a single-crystalline structure grows locally from an exposed region of the semiconductor substrate 100. Consequently, in at least this example embodiment, the epitaxial layer 160 may not grow from the upper surface and the sidewall of the lower interlayer insulation layer 150. The selective epitaxial process may include growing a single-crystalline silicon in a temperature of about 800° C. through a process gas including, for example, DCS (Dichlorosilane), HCl (Hydrochloric acid) or the like. To stabilize the grown single-crystalline silicon layer, a thermal process may be performed. As mentioned in the related art, as the semiconductor device becomes more highly integrated, the widths of the contact holes 155 may be reduced, and filling contact holes 155 using related art deposition techniques may be more difficult. However, as described the above, selectively growing a single-crystalline silicon layer from regions exposed through the contact holes 155 may reduce these and/or other difficulties.

Alternatively, the epitaxial growth process may be performed to fill the contact holes 155 with the epitaxial layer 160. In this example, as illustrated in FIGS. 3A and 3B, the epitaxial layer 160 may cover the lower interlayer insulation layer 150.

Figure 4A:
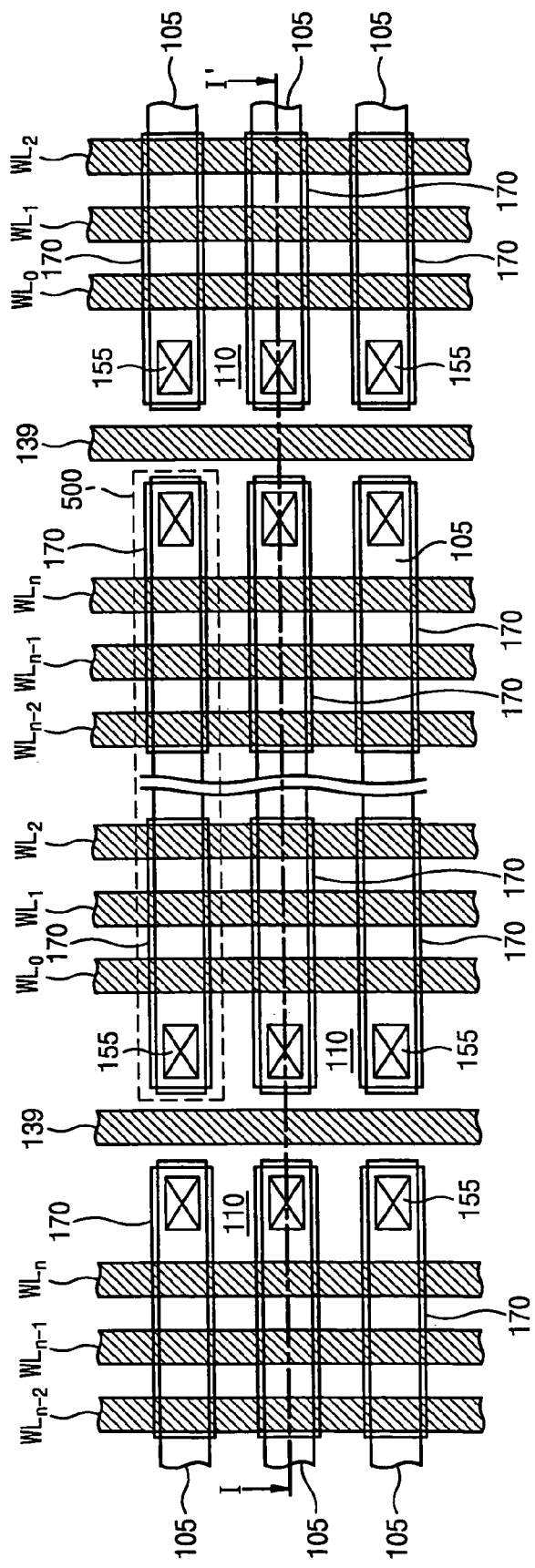
Figure 4B:
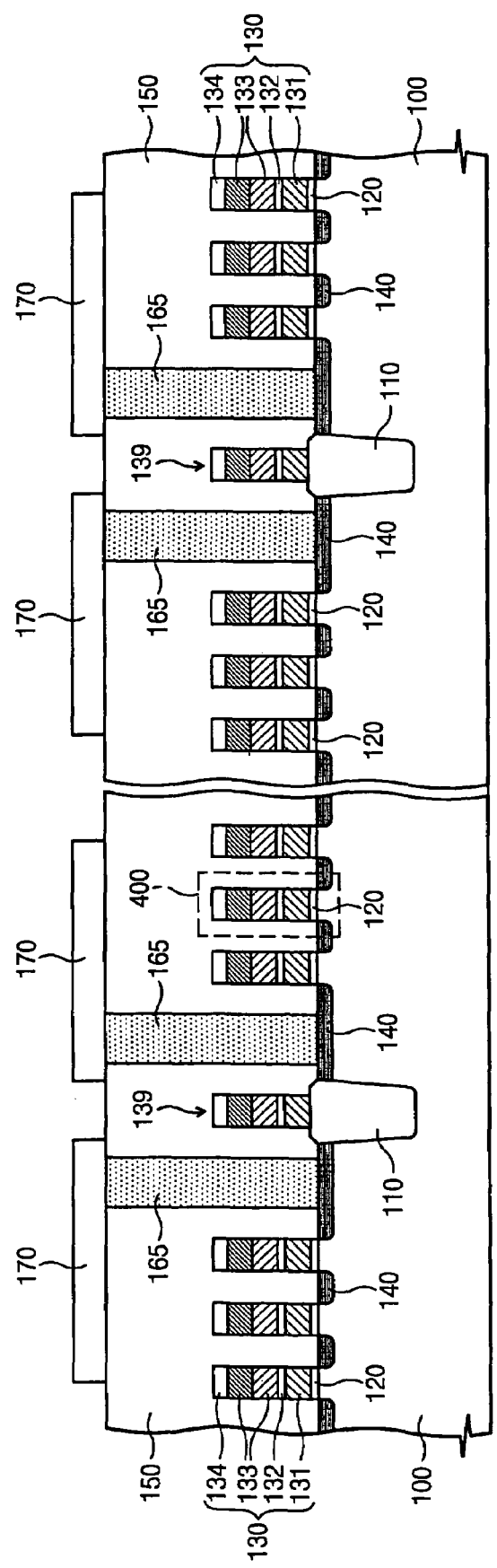

Referring to FIGS. 4A and 4B, the epitaxial layer 160 may be planarized until the upper surface of the lower interlayer insulation layer 150 is exposed. Accordingly, lower plugs 165 may be formed to fill the contact holes 155. According to the example embodiment described above, the lower plugs 165 may be connected to the lower impurity regions 140 disposed on each side of the cell string 500. The planarization etching of the epitaxial layer 160 may be performed using, for example, chemical mechanical polishing (CMP), or the like. Upper active patterns 170, which may be connected (e.g., directly connected) to lower plugs 165, may be formed on the lower interlayer insulation layer 150. The upper active patterns 170 may be used as channel regions of ground and string select transistors. Source and drain electrons of the ground and string select transistors may be formed in the upper active patterns 170. The upper active patterns 170 may be formed of a silicon layer having a conductive type similar or substantially similar to that of the semiconductor substrate 100.

The forming of the upper active pattern 170 may include patterning an upper active layer after forming the upper active layer on the lower plug 165. The patterning of the upper active layer may include etching (e.g., anisotropically etching) the upper active layer to connect each of the upper active patterns 170 with at least one lower plug 165 using a mask pattern as an etching mask. Consequently, each of two different upper active patterns 170 may be connected to the one cell string 500 through two lower plugs 165 disposed on both sides of the one cell string 500, as illustrated in FIGS. 4A and 4B. According to at least one example embodiment, the upper active layer may be, for example, a polysilicon layer (or the like) formed using a vapor deposition method, or the like.

According to another example embodiment, the upper active layer may be a remnant of the epitaxial layer 160. In this example, the epitaxial layer 160 may cover the lower interlayer insulation layer 150. The upper active layer may be, the epitaxial layer 160 formed using these methods. In at least this example, the upper active patterns 170 may correspond to a resultant structure sequentially crystal-grown from the lower plugs 165 below the upper active patterns 170.

Figure 9:
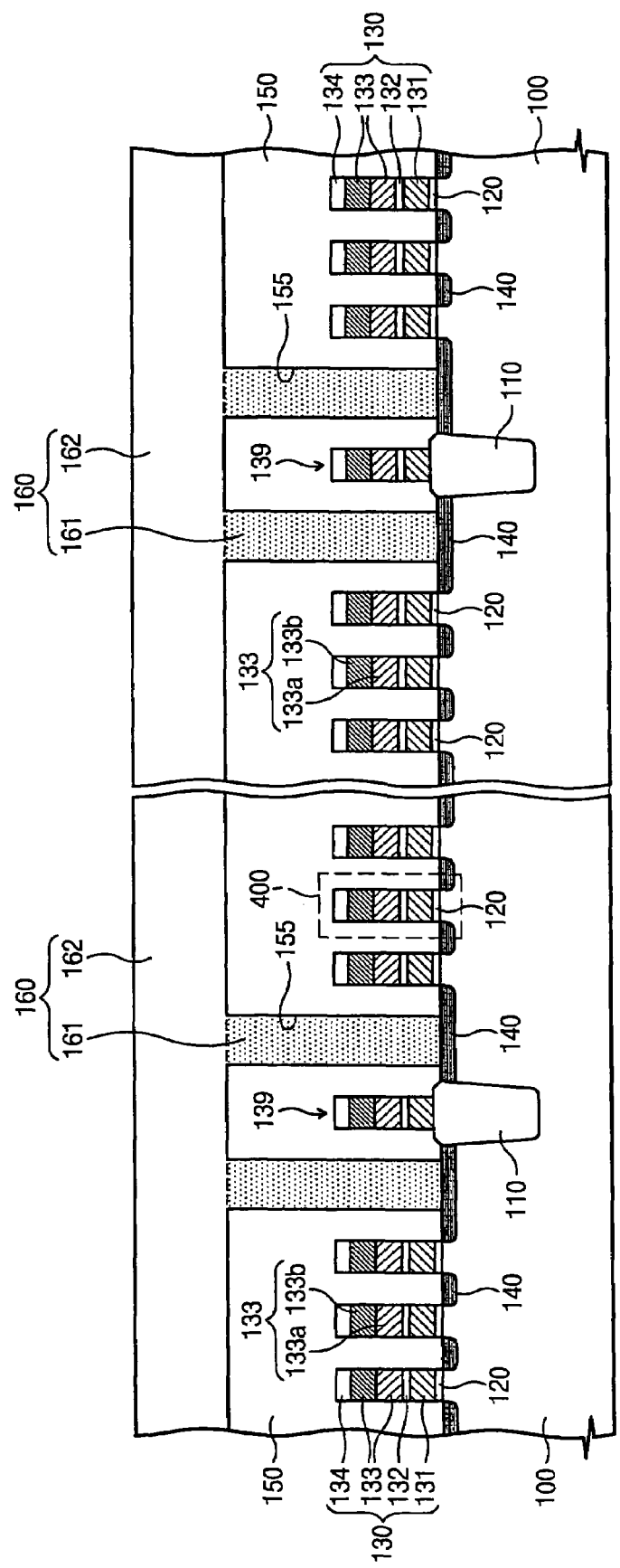
FIG. 9 is a plan view illustrating a method of fabricating a NAND flash memory device, according to another example embodiment.

A planarization etching process for the forming of the lower plugs 165 may be changed to allow the epitaxial layer 160 to remain at a thickness on the lower interlayer insulation layer 150. Additionally, considering that the upper active pattern 170 may need the same or substantially the same conductive-type as the semiconductor substrate 100, the forming of the epitaxial layer 160 may be divided into first and second operations to form silicon layers having different respective conductive types as illustrated, for example, in FIG. 9. In at least this example embodiment, in the first operation, the contact hole 155 may be filled with the lower silicon layer 161 of a conductive layer different from that of the semiconductor substrate 100. In the second operation, the upper surface of the bottom interlayer insulation layer 150 may be covered with the upper silicon layer 162 having the same or substantially the same conductive type as the semiconductor substrate 100.

Figure 5A:
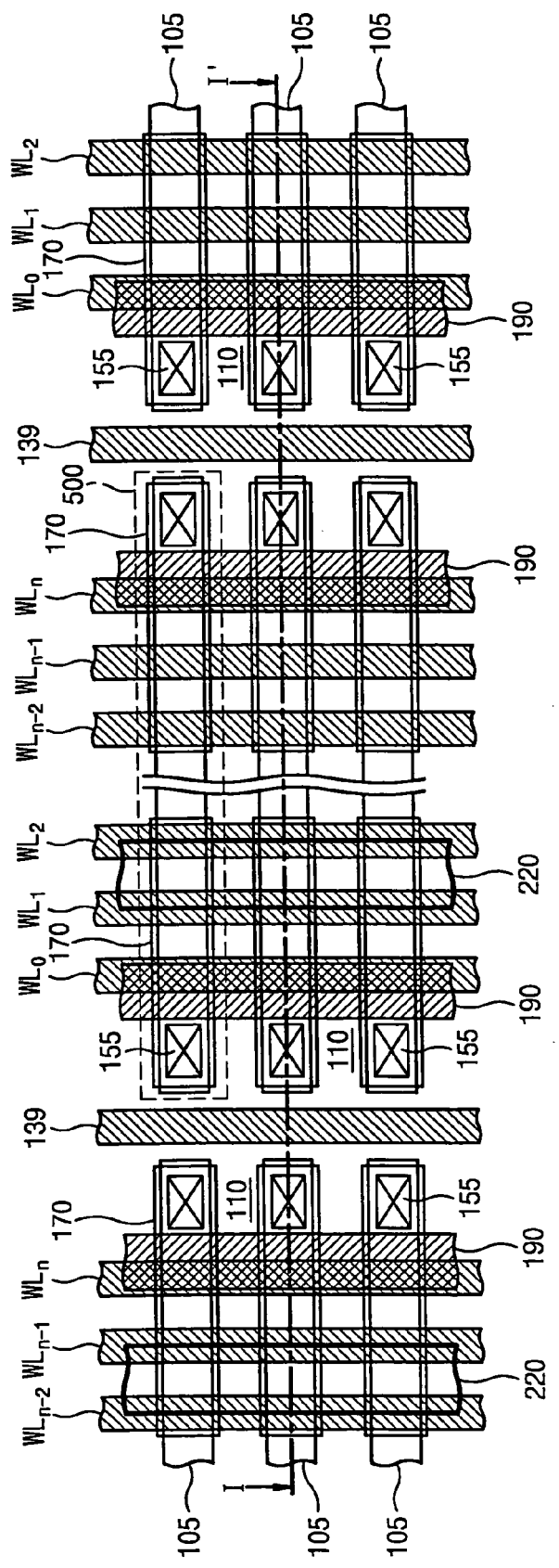
Figure 5B:
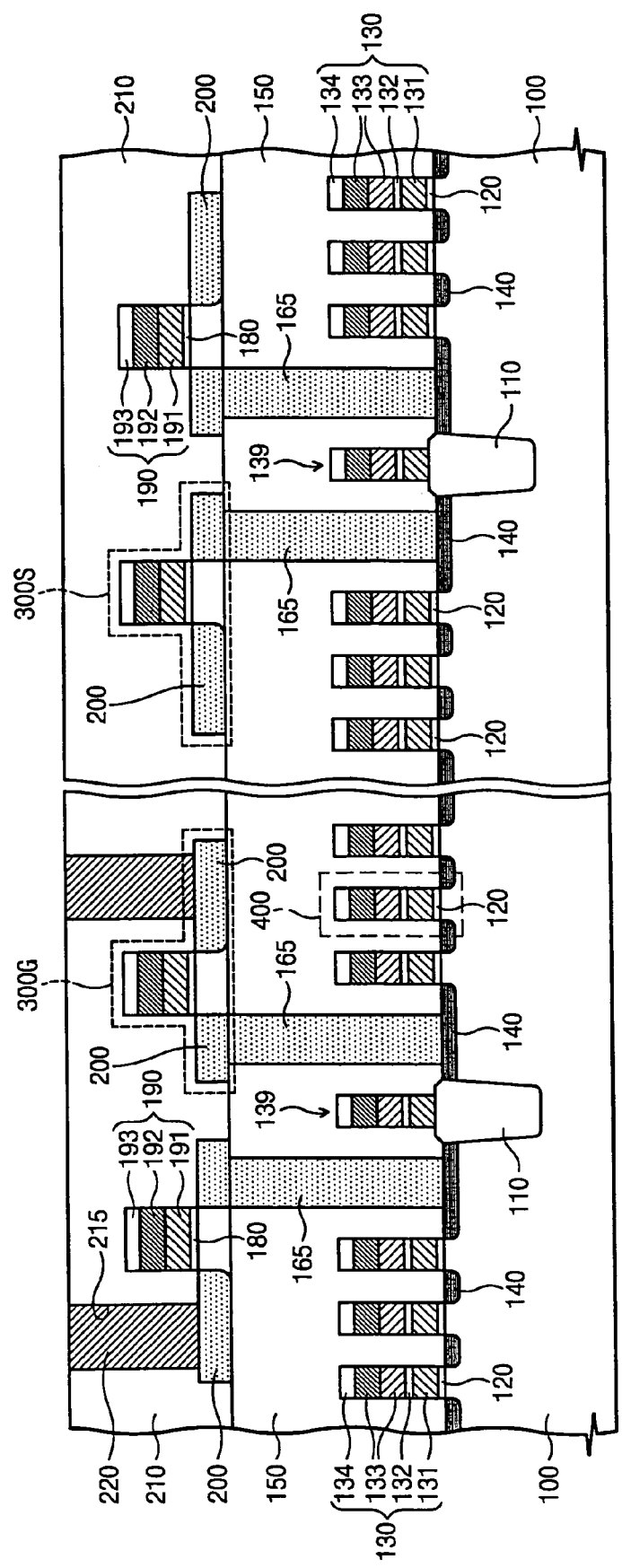

Referring to FIGS. 5A and 5B, a select gate insulation layer 180 may be formed on the upper active patterns 170. The select gate insulation layer 180 may be formed of a silicon oxide layer, one or more high-k dielectrics a silicon oxide layer formed using a thermal oxidation process, a combination thereof or the like. Select gate patterns 190, which cross over the upper active patterns 170 in a direction of the memory gate patterns 130, may be formed on the resultant structure on which the select gate insulation layer 180 is formed. The select gate patterns 190 may be formed of at least one conductive material, for example, a polysilicon layer 191 and a silicide layer 192 stacked sequentially. A select gate capping pattern 193 may be formed on the silicide layer 192, which may be used as an etching mask in a patterning process for forming the select gate pattern 190.

Upper impurity region 200 may be formed in the select gate patterns 190 each side of the select gate pattern 190 by performing an ion implantation process using the select gate patterns 190 as an ion mask. The upper impurity region 200 may be formed with the same or substantially the same conductive type as the lower plug 165. The select gate pattern 190 and the upper impurity region 200 may constitute a ground select transistor 300G and a string select transistor 300S. In at least this example embodiment, the select gate patterns 190 may be used as gate electrodes and the upper impurity regions 200 may be used as source/drain electrodes of the select transistors 300G and 300S. The select gate pattern 190, which may be used as an ion mask, may not be formed on the lower plug 165 to allow the upper impurity regions 200 to be connected to the lower plugs 165.

A first upper interlayer insulation layer 210 may be formed on the resultant on which the upper impurity region 200 is formed. Consequently, the first upper interlayer insulation layer 210 may fill a space between the top active patterns 170 and cover the select gate patterns 190. The first upper interlayer insulation layer 210 may be formed of a silicon oxide layer or the like. Alternatively, an additional insulation layer (not shown) may be formed. The additional insulation layer may fill a space between the upper active patterns 170 before forming the select gate patterns 190. In this example, because the select gate patterns 190 may include a flat bottom, the total length of the select gate pattern 190 may be reduced.

A common source line 220 connecting the upper impurity regions 200 of the ground select transistors 300G in the direction of the memory gate patterns 130 may be formed. The common source line 220 may connect the upper impurity regions 200 connected to the lower plugs 165. Additionally, the string select transistors 300S may not be connected to the common source line 220. Consequently, one cell string 500 may be connected to the common source line 220 through the lower plug 165 and the ground select transistor 300G.

Forming the common source line 220 may include patterning the first upper interlayer insulation layer 210, forming trenches exposing the upper surfaces of the upper impurity regions 200 and forming a conductive layer filling the trenches 215. The conductive layer may be etched (e.g., planarization-etched) until the upper surface of the first upper interlayer insulation layer 210 is exposed to form the common source line. The common source line 220 may be formed of a metallic material (e.g., tungsten, aluminum or the like) having a lower resistivity.

Alternatively, the select gate insulation layer 180 and the select gate patterns 190 may be formed of a structure different from that of the gate insulation layer 120 and the memory gate patterns 130. Because the select transistors 300G and 300S and the memory transistor 400 have respectively different functions, the required characteristics may be different. In this example, the structural difference of components constituting transistors may allow functions of each transistor to be improved independently.

Figure 6A:
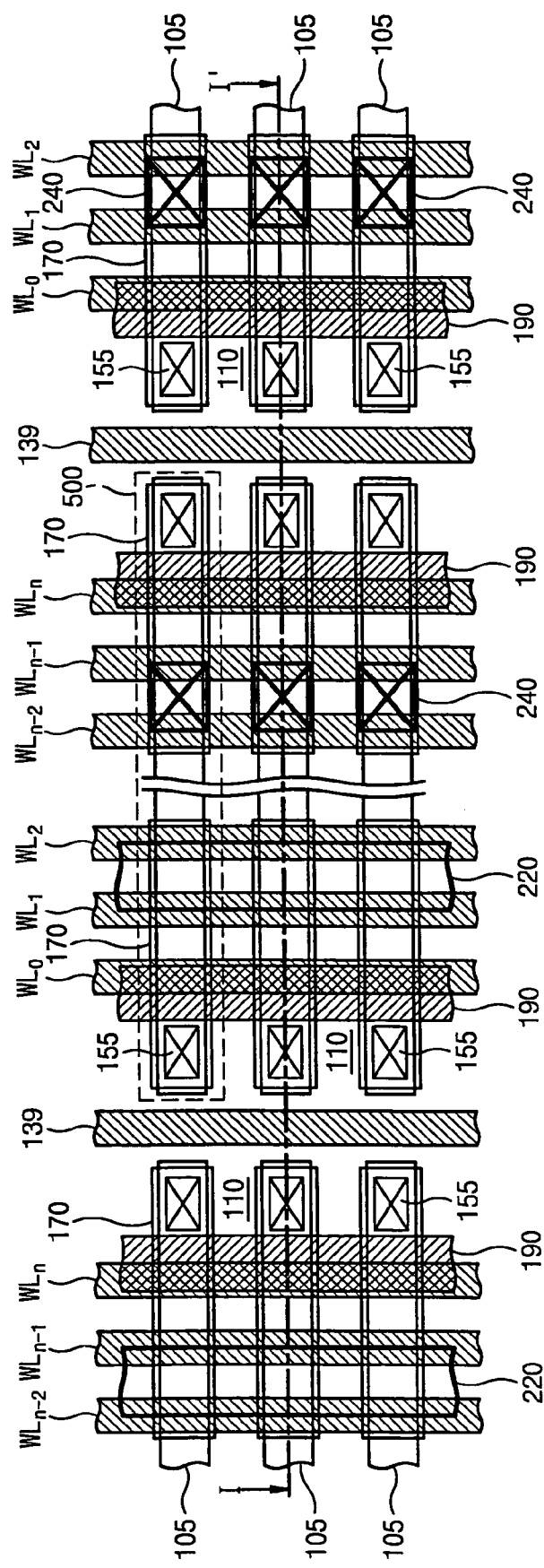
Figure 6B:
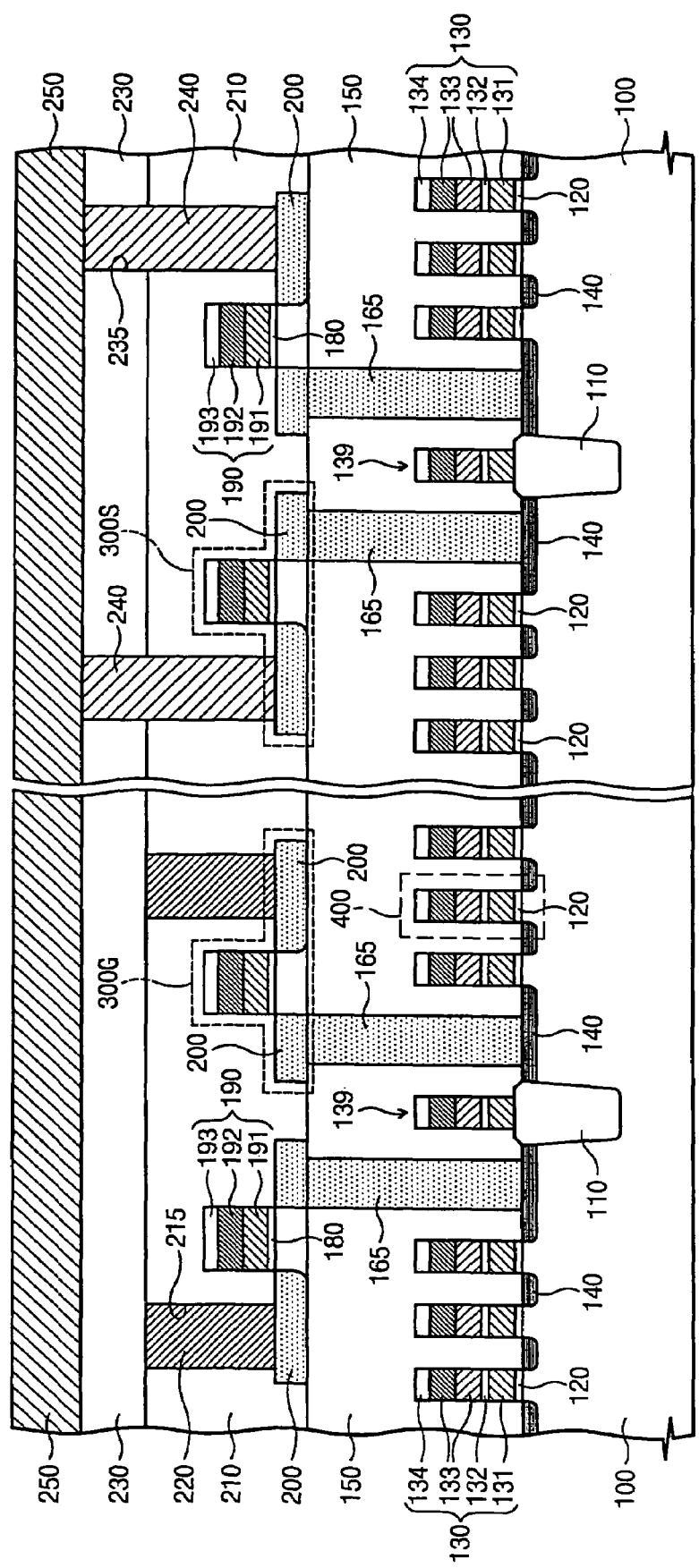

Referring to FIGS. 6A and 6B, upper contact holes 235 exposing the upper impurity region 200 of the string select transistor 300S may be formed by sequentially patterning the first and second upper interlayer insulation layers 210 and 230 after the second upper interlayer insulation layer 230 is formed on the resultant structure on which the common source line 220 is formed. The upper contact holes 235 may expose the upper impurity regions 200 that is not connected to the lower plug 165 of the string select transistor 300S. The second upper interlayer insulation layer 230 may be formed of a silicon oxide layer, low-k dielectrics a combination thereof or the like.

An upper plug 240 may be formed to fill the upper contract holes 235. The forming of the upper plug 240 may include forming a conductive layer filling the upper contract holes 235 and etching (e.g., planarization-etching) the conductive layer until the upper surface of the second upper interlayer insulation layer 230 is exposed. After a bit line conductive layer is formed on the resultant on which the upper plug 240 is formed, bit lines 250 crossing over the memory gate patterns 130 may be formed by patterning the result on which the bit line conductive line is formed. Each of the bit lines 250 may be connected to ends of the string select transistor 300S and the cell string 500 through the upper plug 240 below the bit lines 250. The bit lines 250 may be formed of a metallic material or alloy (e.g., aluminum or the like) having a lower resistivity.

According to example embodiments, select transistors may be formed on memory transistors and an area of a semiconductor substrate necessary for the select transistors may be reduced. In addition or alternatively, electrical disturbance between the transistors and adjacent memory transistors may be suppressed (e.g., minimized). Consequently, a NAND flash memory having a higher degree of integration and/or improved electrical characteristics may be fabricated. Furthermore, according to at least some example embodiments, because the select transistors are fabricated through processes different from that of the memory transistors, characteristics of the memory transistors and the select transistors may be improved independently.

It will be apparent to those skilled in the art that various modifications and variations can be made to example embodiments discussed herein. Thus, it is intended that the present invention covers the modifications and variations provided they come within the scope of the appended claims and their equivalents.

What is claimed is:

1. A method of fabricating a NAND flash memory device, comprising:
    defining a plurality of active regions in a substrate;
    forming memory transistors on the active regions, the memory transistors including memory gate patterns arranged perpendicular to the plurality of active regions;
    forming lower plugs electrically connected to first regions of the plurality of active regions; and
    forming select transistors above the memory gate patterns, the select transistors including impurity regions, at least one impurity region of each select transistor being electrically connected to a respective first region via a lower plug.

2. The method of claim 1, wherein defining the active regions further includes,
    forming device isolation patterns to define the plurality of active regions.

3. The method of claim 2, wherein dummy gate patterns are formed on device isolation patterns between two adjacent cell strings concurrently with the forming of the memory gate patterns, each dummy gate pattern being disposed parallel to the memory gate patterns.

4. The method of claim 1, wherein the forming of the memory transistors includes,
    forming a gate insulation layer on each active region,
    forming the plurality of memory gate patterns parallel to each other on the gate insulation layer, and
    performing an ion implantation process using the memory gate patterns as an ion mask to form lower impurity regions within the active regions on each side of the memory gate patterns.

5. The method of claim 1, wherein the forming of the lower plugs includes,
    forming a lower interlayer insulation layer on a resultant structure including the memory transistors,
    patterning the lower interlayer insulation layer to form contact holes exposing a portion of the lower impurity regions, and
    forming an epitaxial layer to form the lower plugs in the contact holes.

6. The method of claim 5, wherein the forming of the epitaxial layer includes,
    injecting impurities the same conductive type as the lower impurity regions in the epitaxial layer.

7. The method of claim 5, wherein the epitaxial layer is formed using a selective epitaxial process that grows the epitaxial layer locally from the active regions exposed through the contact holes.

8. The method of claim 1, wherein the lower plugs are formed on each sides of a cell string having a plurality of memory transistors to be connected to upper surfaces of the active regions, wherein
    one cell string includes 8 to 128 memory transistors connected in serial on one active region.

9. The method of claim 8, wherein device isolation patterns define the plurality of active regions, and the device isolation patterns are formed between two adjacent cell strings along the direction of the memory gate pattern.

10. The method of claim 8, wherein after forming the select transistors, the method further includes,
    forming a common source line connecting the upper impurity regions in a direction parallel to a direction of the memory gate patterns, and
    forming bit lines connecting the upper impurity regions in a direction perpendicular to the direction of the memory gate patterns, wherein the common source line and the bit lines are connected to different select transistors.

11. The method of claim 10, wherein the select transistor connected to the common source line is connected to an active region formed on one side of a cell string through the lower plug, and the select transistor connected to the bit line is connected to an active region formed on another side of the cell string through the lower plug.

12. The method of claim 1, wherein a dummy gate pattern is formed perpendicular to the active regions between two adjacent cell strings concurrently with the forming of the memory gate patterns.

13. The method of claim 1, wherein the forming of the select transistors includes,
　　forming an upper active layer on a resultant structure including the lower plugs, the upper active layer having a conductive type identical to that of the substrate,
　　forming upper active patterns connected to the lower plugs by patterning the upper active layer,
　　forming a select gate insulation layer on each upper active pattern;
　　forming a select gate pattern on each select gate insulation layer, the select gate patterns being disposed parallel to the memory gate patterns, and
　　forming upper impurity regions at each side of each select gate pattern using the select gate patterns as an ion mask.

14. The method of claim 13, wherein the forming of the lower plugs includes,
　　forming a lower interlayer insulation layer on a resultant structure including the memory transistors,
　　forming contact holes exposing a portion of the lower impurity regions by patterning the lower interlayer insulation layer, and
　　forming the lower plugs filling the contact holes using epitaxial growth.

15. The method of claim 13, wherein the forming of the upper active layer includes,
　　forming an epitaxial layer covering the lower interlayer insulation layer, and
　　forming the upper active patterns connected to the lower plugs by patterning the epitaxial layer, wherein
　　　the lower plug is formed of silicon having a conductive type different from that of the substrate, and
　　　the epitaxial layer is formed of silicon having a conductive type identical to that of the substrate.

16. The method of claim 15, wherein the epitaxial layer is formed using epitaxial growth.

17. The method of claim 13, wherein the forming of the upper active layer includes,
　　forming an epitaxial layer covering the lower interlayer insulation layer, and
　　forming the upper active patterns connected to the lower plugs by patterning the epitaxial layer, wherein
　　　the forming of the epitaxial layer includes,
　　　　forming a lower silicon layer having a conductive type different from that of the substrate, and
　　　　forming an upper silicon layer on the lower silicon layer, the upper silicon layer having a conductive type identical to that of the substrate.

18. The method of claim 13, wherein the forming of the upper active layer includes,
　　depositing a polysilicon layer on a resultant structure including the lower plugs, the polysilicon layer having a conductive type identical to that of the substrate.

* * * * *